US012684837B2

(12) United States Patent
Iwakaji et al.

(10) Patent No.: US 12,684,837 B2
(45) Date of Patent: Jul. 14, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Keiko Kawamura, Yokohama Kanagawa (JP); Ryohei Gejo, Kawasaki Kanagawa (JP); Kaori Fuse, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 488 days.

(21) Appl. No.: 18/159,322

(22) Filed: Jan. 25, 2023

(65) Prior Publication Data

US 2024/0079448 A1    Mar. 7, 2024

(30) Foreign Application Priority Data

Sep. 7, 2022    (JP) ................................. 2022-142509

(51) Int. Cl.
*H10D 62/10*         (2025.01)
*H10D 12/00*         (2025.01)
*H10D 64/23*         (2025.01)

(52) U.S. Cl.
CPC ......... *H10D 62/124* (2025.01); *H10D 12/481* (2025.01); *H10D 62/105* (2025.01); *H10D 64/231* (2025.01)

(58) Field of Classification Search
CPC .. H10D 62/124; H10D 12/481; H10D 62/105; H10D 64/231; H10D 8/422;
(Continued)

(56) References Cited

U.S. PATENT DOCUMENTS

| 6,342,709 B1 | 1/2002 | Sugawara et al. |
| 10,374,080 B2 | 8/2019 | Ohse et al. |

(Continued)

FOREIGN PATENT DOCUMENTS

| JP | H10-98188 A | 4/1998 |
| JP | 2001-308328 A | 11/2001 |

(Continued)

OTHER PUBLICATIONS

Luo, Peng et al. "Dynamic Avalanche Free Design in 1.2kV Si-IGBTs for Ultra High Current Density Operation," 2019 IEEE International Electron Devices Meeting (IEDM), San Francisco, CA, USA, 2019, pp. 12.3.1-12.3.4.

(Continued)

*Primary Examiner* — Shahed Ahmed
(74) *Attorney, Agent, or Firm* — Kim & Stewart LLP

(57)            ABSTRACT

According to one embodiment, a semiconductor device includes first and second electrodes, a first conductive member, a semiconductor member, and an insulating member. The first electrode includes a first face. The second electrode includes a first conductive region and a first conductive portion. The first conductive portion is electrically connected to the first conductive region. The first conductive member is provided between the first face and the first conductive region. The semiconductor member is provided between the first face and the second electrode. The semiconductor member includes a first semiconductor region of a first conductive type, a second semiconductor region of a second conductive type, a third semiconductor region of the second conductive type, a fourth semiconductor region of the first conductive type, and a fifth semiconductor region of the first conductive type. The second semiconductor region is located between the third partial region and the third semiconductor region.

21 Claims, 6 Drawing Sheets

(58) Field of Classification Search
CPC .... H10D 62/10; H10D 62/126; H10D 64/117;
H10D 64/23; H10D 64/513; H10D
12/411–491; H10D 12/031–038; H10D
62/141–148; H10D 84/40–409; H10D
84/811–817; H10D 62/60–605
See application file for complete search history.

(56) References Cited

U.S. PATENT DOCUMENTS

| 10,600,867 | B2 | 3/2020 | Naito | |
|---|---|---|---|---|
| 11,133,378 | B2 | 9/2021 | Siemieniec et al. | |
| 2006/0289928 | A1 | 12/2006 | Takaya et al. | |
| 2014/0048847 | A1 | 2/2014 | Yamashita et al. | |
| 2015/0144988 | A1 | 5/2015 | Laven et al. | |
| 2016/0172453 | A1 | 6/2016 | Hirabayashi et al. | |
| 2017/0040446 | A1 | 2/2017 | Saito et al. | |
| 2017/0148786 | A1 | 5/2017 | Matsushita et al. | |
| 2018/0151558 | A1 | 5/2018 | Cheng et al. | |
| 2018/0286971 | A1 | 10/2018 | Philippou et al. | |
| 2018/0308839 | A1 | 10/2018 | Takahashi | |
| 2018/0337233 | A1* | 11/2018 | Naito | H10D 64/231 |
| 2020/0098747 | A1* | 3/2020 | Tamura | H10D 84/811 |
| 2021/0296477 | A1 | 9/2021 | Matsudai et al. | |
| 2021/0351284 | A1 | 11/2021 | Kubouchi | |
| 2023/0299076 | A1 | 9/2023 | Itokazu et al. | |
| 2023/0307555 | A1 | 9/2023 | Fuse et al. | |
| 2024/0405110 | A1* | 12/2024 | Osawa | H10D 12/481 |

FOREIGN PATENT DOCUMENTS

| JP | 2005-116822 | A | 4/2005 |
|---|---|---|---|
| JP | 2013048230 | A | 3/2013 |
| JP | 5443670 | B2 | 3/2014 |
| JP | 2016-115847 | A | 6/2016 |
| JP | 6208579 | B2 | 10/2017 |
| JP | 2018-182235 | A | 11/2018 |
| JP | 2018-182313 | A | 11/2018 |
| JP | 2018195798 | A | 12/2018 |
| JP | 6694375 | B2 | 5/2020 |
| JP | 2021-150483 | A | 9/2021 |
| JP | 6959407 | B2 | 11/2021 |
| JP | 6981585 | B1 | 12/2021 |
| JP | 2022059082 | A | 4/2022 |
| JP | 2023-136874 | A | 9/2023 |
| JP | 2023-140256 | A | 10/2023 |

OTHER PUBLICATIONS

Rahman, M. T. et al. "A novel carrier accumulating structure for 1200V IGBTs without negative capacitance and decreasing breakdown-voltage," 2018 IEEE 30th International Symposium on Power Semiconductor Devices and ICs (ISPSD), May 13-17, 2018, Chicago, IL, USA, pp. 491-494.
Takaya, H. et al. "Floating Island and Thick Bottom Oxide Trench Gate MOSFET (FITMOS)—A 60V Ultra Low On-Resistance Novel MOSFET with Superior Internal Body Diode," Proceedings. ISPSD '05. The 17th International Symposium on Power Semiconductor Devices and ICs, 2005, Santa Barbara, CA, USA, 2005, pp. 1-4.
Notice of Reasons for Refusal (Office Action) mailed Jun. 27, 2025 in counterpart Japanese Patent Application No. 2022-142509, with English machine translation, 14 pages.

* cited by examiner

SEMICONDUCTOR DEVICE

CROSS-REFERENCE TO RELATED APPLICATIONS

This application is based upon and claims the benefit of priority from Japanese Patent Application No. 2022-142509, filed on Sep. 7, 2022; the entire contents of which are incorporated herein by reference.

FIELD

Embodiments described herein generally relate to a semiconductor device.

BACKGROUND

For example, in a semiconductor device, reduction of loss is desired.

DETAILED DESCRIPTION

Figure 1:
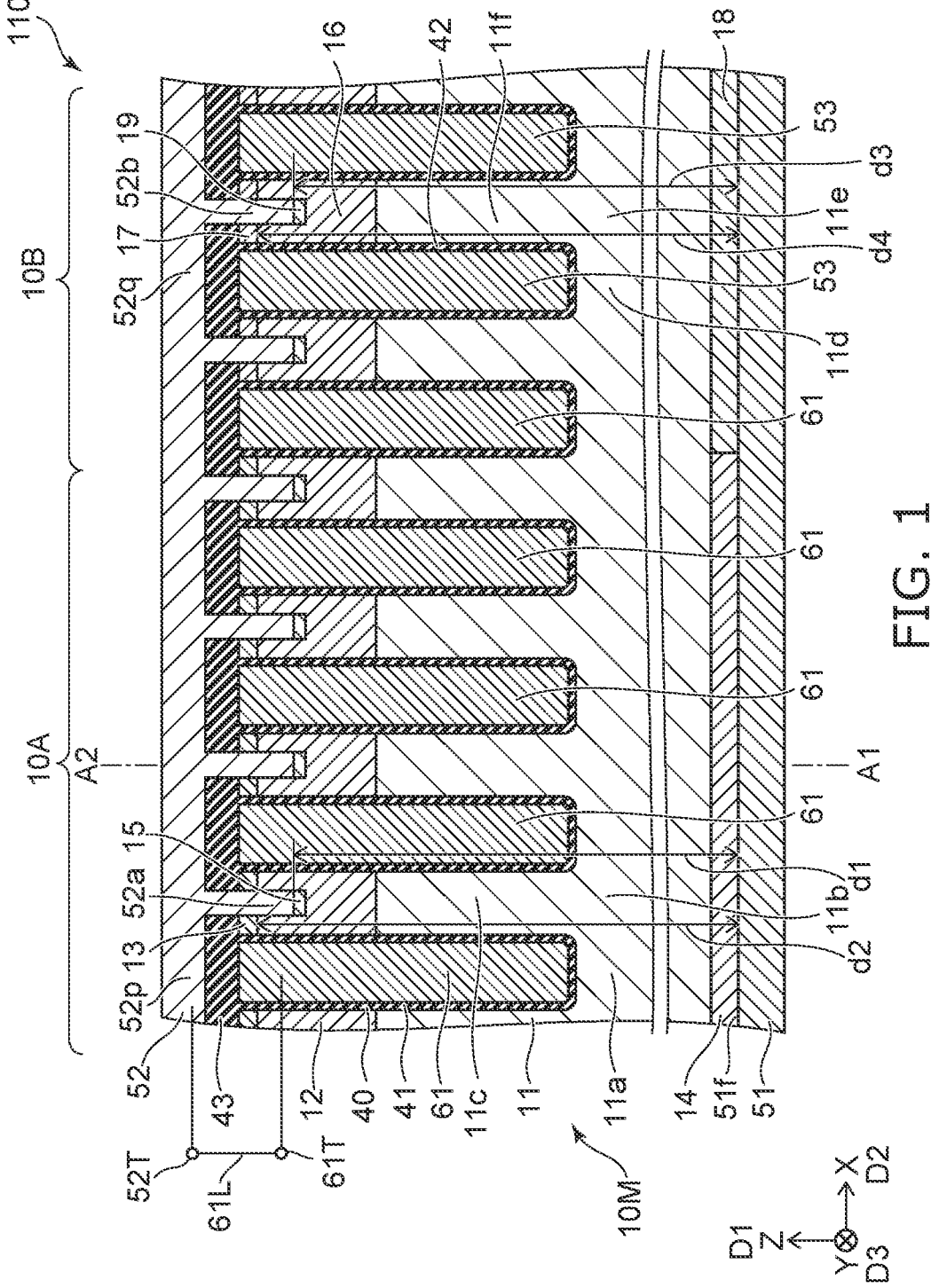
FIG. 1 is a schematic cross-sectional view illustrating a semiconductor device according to a first embodiment.

According to one embodiment, a semiconductor device includes a first electrode, a second electrode, a first conductive member, a semiconductor member, and an insulating member. The first electrode includes a first face. The second electrode includes a first conductive region and a first conductive portion. The first conductive portion is electrically connected to the first conductive region. The first conductive member is provided between the first face and the first conductive region. The semiconductor member is provided between the first face and the second electrode. The semiconductor member includes a first semiconductor region of a first conductive type, a second semiconductor region of a second conductive type, a third semiconductor region of the second conductive type, a fourth semiconductor region of the first conductive type, and a fifth semiconductor region of the first conductive type. The first semiconductor region includes a first partial region, a second partial region, and a third partial region. The first partial region is located between the first face and the first conductive member in a first direction perpendicular to the first face. A second direction from the first partial region to the second partial region crosses the first direction. The second partial region is located between the first face and the third partial region in the first direction. A direction from the first conductive member to the third partial region is along the second direction. A part of the second semiconductor region is provided between a part of the first conductive member and the first conductive portion. The second semiconductor region is located between the third partial region and the third semiconductor region in the first direction. A direction from another part of the first conductive member to the third semiconductor region is along the second direction. A third carrier concentration of the second conductive type in the third semiconductor region is higher than a second carrier concentration of the second conductive type in the second semiconductor region. The fourth semiconductor region is located between the first face and the first partial region, and between the first face and the second partial region. The fifth semiconductor region is located between at least a part of the second semiconductor region and at least a part of the first conductive portion in the first direction. The insulating member includes a first insulating region. The first insulating region is provided between the semiconductor member and the first conductive member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a first conductive member 61, a semiconductor member 10M, and an insulating member 40.

The first electrode 51 includes a first face 51$f$. The first face 51$f$ is, for example, an upper face of the first electrode 51.

The second electrode 52 includes a first conductive region 52$p$ and a first conductive portion 52$a$. The first conductive portion 52$a$ is electrically connected to the first conductive region 52$p$. The material of the first conductive portion 52$a$ may be different from the material of the first conductive region 52$p$. The material of the first conductive portion 52$a$ may be the same as the material of the first conductive region 52$p$. The boundary between the first conductive portion 52$a$ and the first conductive region 52$p$ may be clear or unclear.

The first conductive member 61 is provided between the first face 51$f$ and the first conductive region 52$p$.

The semiconductor member 10M is provided between the first face 51$f$ and the second electrode 52. The semiconductor member 10M includes a first semiconductor region 11 of a first conductivity type, a second semiconductor region 12 of a second conductivity type, a third semiconductor region 13 of the second conductivity type, a fourth semiconductor region 14 of the first conductivity type, and a fifth semiconductor region 15 of the first conductivity type.

For example, the first conductive type is n-type and the second conductive type is p-type. In the embodiments, the first conductive type may be p-type and the second conductive type may be n-type. Hereinafter, the first conductive type is n-type and the second conductive type is p-type.

The first semiconductor region 11 includes a first partial region 11$a$, a second partial region 11$b$, and a third partial region 11$c$. The first partial region 11$a$ is located between the first face 51$f$ and the first conductive member 61 in a first direction D1. The first direction D1 is perpendicular to the first face 51$f$. The first direction D1 corresponds to a direction from the first face 51$f$ to the second electrode 52.

The first direction D1 is defined as a Z-axis direction. One direction perpendicular to the Z-direction is defined as an X-direction. The direction perpendicular to the Z-axis direction and the X-axis direction is defined as a Y-axis direction.

A second direction D2 from the first partial region 11$a$ to the second partial region 11$b$ crosses the first direction D1. The second direction D2 is, for example, the X-axis direction.

The second partial region 11$b$ is located between the first face 51$f$ and the third partial region 11$c$ in the first direction D1. At least a part of the third partial region 11$c$ is located between the second partial region 11$b$ and the first conductive portion 52$a$ in the first direction D1. A direction from the first conductive member 61 to the third partial region 11$c$ is along the second direction D2.

The first partial region 11$a$ overlaps the first conductive member 61 in the first direction D1. The second partial region 11$b$ and the third partial region 11$c$ are regions that do not overlap the first conductive member 61 in the first direction D1. The third partial region 11$c$ overlaps the first conductive member 61 in the second direction D2. The boundary between the first partial region 11$a$, the second partial region 11$b$, and the third partial region 11$c$ may be clear or unclear.

In the second direction D2, a part of the second semiconductor region 12 is located between a part of the first conductive member 61 and the first conductive portion 52$a$. Another part of the second semiconductor region 12 is located between the third partial region 11$c$ and the first conductive portion 52$a$.

A part of the second semiconductor region 12 is located between the third partial region 11$c$ and the third semiconductor region 13 in the first direction D1. A direction from the other part of the first conductive member 61 to the third semiconductor region 13 is along the second direction D2. A third carrier concentration of the second conductive type in the third semiconductor region 13 is higher than a second carrier concentration of the second conductive type in the second semiconductor region 12. For example, the second semiconductor region 12 is a p-layer. The third semiconductor region 13 is a p+-layer. The third semiconductor region 13 is electrically connected to the second electrode 52.

The fourth semiconductor region 14 is located between the first face 51$f$ and the first partial region 11$a$, and between the first face 51$f$ and the second partial region 11$b$. The fifth semiconductor region 15 is located between at least a part of the second semiconductor region 12 and at least a part of the first conductive portion 52$a$ in the first direction D1.

The insulating member 40 includes a first insulating region 41. The first insulating region 41 is provided between the semiconductor member 10M and the first conductive member 61. The first insulating region 41 electrically insulates, for example, the semiconductor member 10M and the first conductive member 61.

A region including the first electrode 51, the second electrode 52, the first semiconductor region 11, the second semiconductor region 12, the third semiconductor region 13, and the fourth semiconductor region 14 is included in a first element 10A. The first element 10A functions as a diode, for example. As will be described below, the semiconductor device 110 may further include a second element 10B. The second element 10B is, for example, an insulated gate bipolar transistor (IGBT). When the first element 10A is combined with the second element 10B, the first element 10A functions as an FWD (Free-Wheel Diode), for example. The first element 10A and the second element 10B are, for example, a reverse conducting IGBT (RC-IGBT).

In the first element 10A functioning as a diode, the first semiconductor region 11 corresponds to an n-base layer, for example. The second semiconductor region 12 corresponds to the p-anode layer, for example. The third semiconductor region 13 corresponds to the p+-anode layer, for example. The fourth semiconductor region 14 corresponds to the n-cathode layer, for example.

For example, the first conductive member 61 is electrically connected to the second electrode 52. Alternatively, the first conductive member 61 can be electrically connected to the second electrode 52. For example, the first conductive member 61 may be electrically connected to the second electrode 52 by a connecting member 61L or the like at a position different from the position of the cross section in FIG. 1. For example, a first conductive member terminal 61T electrically connected to the first conductive member 61 may be provided. A second electrode terminal 52T electrically connected to the second electrode 52 may be provided. These terminals may be connected by the connecting member 61L.

The first conductive member 61 is a dummy conductive portion having a structure similar to that of the third electrode 53 described below.

As described above, in the second direction D2, a portion of the second semiconductor region 12 is located between a portion of the first conductive member 61 and the first conductive portion 52$a$. For example, with reference to the first face 51$f$, the lower end of the first conductive portion 52$a$ is below the third semiconductor region 13. As a result, loss can be reduced as described below.

For example, as shown in FIG. 1, a distance between the first face 51$f$ and the first conductive portion 52$a$ along the first direction D1 is defined as a first distance d1. A distance between the first face 51$f$ and the third semiconductor region 13 along the first direction D1 is defined as a second distance d2. The first distance d1 is shorter than the second distance d2.

In conduction of the FWD, for example, electrons injected from the first electrode 51 flow toward the second electrode 52, and holes are injected into the semiconductor member 10M. In the embodiment, the first conductive portion 52$a$ is provided in the second electrode 52. The first conductive portion 52$a$ enters the semiconductor member 10M and functions as a trench contact. For example, as described above, the first distance d1 is shorter than the second distance d2. Thereby, the amount of holes injected into the semiconductor member 10M can be reduced. As a result, the recovery loss is reduced. According to the embodiment, a semiconductor device capable of reducing a loss can be provided.

A fifth carrier concentration of the first conductive type in the fifth semiconductor region 15 is higher than a first carrier concentration of the first conductive type in the first semiconductor region 11. The first semiconductor region 11 is, for example, an n--layer. The fifth semiconductor region 15 is, for example, an n-layer. The fifth semiconductor region 15 functions as an n-contact layer, for example.

In the embodiment, by providing the fifth semiconductor region 15 (for example, the n-contact layer) the emission of electrons is promoted, for example. The injection of holes can be suppressed more. According to the embodiment, the injection amount of holes into the semiconductor member 10M can be suppressed. The recovery loss can be reduced. According to the embodiment, a semiconductor device capable of reducing a loss can be provided. When the fifth semiconductor region 15 is provided, the structure would become complicated. The improvement of the characteristics is obtained which exceeds the demerit of the complicated structure.

In the embodiments, the semiconductor member 10M includes, for example, silicon. For example, the first semiconductor region 11 may include an n-silicon substrate. In the embodiments, the semiconductor member 10M may include, for example, SiC or GaN.

As shown in FIG. 1, the semiconductor device 110 may further include the third electrode 53. As shown in FIG. 1, the second electrode 52 may include a second conductive region 52q and a second conductive portion 52b. The second conductive portion 52b is electrically connected to the second conductive region 52q.

The material of the second conductive portion 52b may be different from the material of the second conductive region 52q. The material of the second conductive portion 52b may be the same as the material of the second conductive region 52q. The boundary between the second conductive portion 52b and the second conductive region 52q may be clear or unclear. The second conductive region 52q may be continuous with the first conductive region 52p. For example, a direction from the first conductive region 52p to the second conductive region 52q is along the second direction D2. For example, a direction from the first conductive portion 52a to the second conductive portion 52b is along the second direction D2.

The third electrode 53 is located between the first face 51f and the second conductive region 52q. The semiconductor member 10M further includes a sixth semiconductor region 16 of the second conductive type, a seventh semiconductor region 17 of the first conductive type, and an eighth semiconductor region 18 of the second conductive type. The first semiconductor region 11 includes a fourth partial region 11d, a fifth partial region 11e, and a sixth partial region 11f.

The fourth partial region 11d is located between the first face 51f and the third electrode 53 in the first direction D1. A direction from the fourth partial region 11d to the fifth partial region 11e is along the second direction D2. The fifth partial region 11e is located between the first face 51f and the sixth partial region 11f in the first direction D1. A direction from the third electrode 53 to the sixth partial region 11f is along the second direction D2.

The fourth partial region 11d overlaps the third electrode 53 in the first direction D1. The fifth partial region 11e and the sixth partial region 11f are regions that do not overlap the third electrode 53 in the first direction D1. The sixth partial region 11f overlaps the third electrode 53 in the second direction D2. The boundary between the fourth partial region 11d, the fifth partial region 11e and the sixth partial region 11f may be clear or unclear.

In the second direction D2, a part of the sixth semiconductor region 16 is located between a part of the third electrode 53 and the second conductive portion 52b. The sixth semiconductor region 16 is located between the sixth partial region 11f and the seventh semiconductor region 17 in the first direction D1. A direction from a part of the third electrode 53 to the seventh semiconductor region 17 is along the second direction D2. A seventh semiconductor region 17 is provided between another part of the third electrode 53 and the second conductive portion 52b.

The second electrode 52 is electrically connected to, for example, the seventh semiconductor region 17. The second electrode 52 may be electrically connected to the sixth semiconductor region 16.

The eighth semiconductor region 18 is located between the first face 51f and the fourth partial region 11d, and between the first face 51f and the fifth partial region 11e.

The insulating member 40 further includes a second insulating region 42. The second insulating region 42 is provided between the semiconductor member 10M and the third electrode 53.

A current flowing between the first electrode 51 and the second electrode 52 can be controlled by a potential of the third electrode 53. The potential of the third electrode 53 may be a potential based on a potential of the second electrode 52.

A region including the third electrode 53, the sixth semiconductor region 16, the seventh semiconductor region 17, and the eighth semiconductor region 18 is included in a second element 10B. The second element 10B functions as an IGBT, for example. In the second element 10B, the first electrode 51 functions as a collector electrode. The second electrode 52 functions as an emitter electrode. The third electrode 53 functions as a gate electrode.

In the second element 10B, the first semiconductor region 11 corresponds to an n--base layer. The sixth semiconductor region 16 corresponds to a p-base layer. The seventh semiconductor region 17 corresponds to an n-emitter layer. The eighth semiconductor region 18 corresponds to a p-collector layer.

As shown in FIG. 1, the semiconductor member 10M may further include a ninth semiconductor region 19 of a second conductive type. The ninth semiconductor region 19 is provided between the sixth semiconductor region 16 and the second conductive portion 52b. A ninth carrier concentration of the second conductive type in the ninth semiconductor region 19 is higher than a sixth carrier concentration of the second conductive type in the sixth semiconductor region 16. The sixth semiconductor region 16 is, for example, a p-layer. The ninth semiconductor region 19 is a p layer or a p+-layer. The ninth semiconductor region 19 corresponds to a p-contact layer, for example.

As shown in FIG. 1, a distance between the first face 51f and the second conductive portion 52b along the first direction D1 is defined as a third distance d3. A distance between the first face 51f and the seventh semiconductor region 17 along the first direction D1 is defined as a fourth distance d4. The third distance d3 is shorter than the fourth distance d4.

In the second element 10B, the amount of holes injected into the semiconductor member 10M can be reduced. The loss can be reduced.

In the first element 10A of the semiconductor device 110, the first conductive portion 52a may make a Schottky contact with the fifth semiconductor region 15 (for example, the n-contact layer). For example, a high breakdown voltage is easily obtained.

As described above, the second conductive portion 52b is included in the second element 10B (IGBT). On the other hand, the first conductive portion 52a is included in the first element 10A (FWD). The second conductive portion 52b may include a material different from the material included in the first conductive portion 52a.

For example, the first conductive portion 52a may include a material that is easy to make a Schottky contact with the n-type semiconductor (for example, n-type silicon). In one example, the first conductive portion 52a includes at least one selected from the group consisting of Pt, V, Ti, TiN, Al, W, and Ni. In one example, the first conductive portion 52a may include at least one selected from the group consisting of Pt, V, Ti, TiN, and Ni. On the other hand, the second conductive portion 52b may include a material that is easy to make an ohmic contact with the p-type semiconductor (for example, p-type silicon). In one example, the second conductive portion 52b may include, for example, at least one selected from the group consisting of Al, W, and Ta. For example, the second conductive portion 52b may include, for example, a silicide of at least one selected from the group consisting of Al, W, and Ta. For example, the contact resistance between the first conductive portion 52a and the fifth semiconductor region 15 may be higher than the contact resistance between the second conductive portion 52b and the ninth semiconductor region 19.

As shown in FIG. 1, the insulating member 40 may include a third insulating region 43. The third insulating region 43 is provided between the first conductive member 61 and the second electrode 52. The third insulating region 43 is provided between the third electrode 53 and the second electrode 52. For example, the third insulating region 43 is provided between the first conductive member 61 and the first conductive region 52p. The third insulating region 43 is provided between the third electrode 53 and the second conductive region 52q.

For example, the first conductive member 61 extends along a third direction D3. The third direction D3 crosses a plane including the first direction D1 and the second direction D2. The third direction D3 is, for example, the Y-axis direction. A plurality of first conductive members 61 may be provided. A direction from one of the plurality of first conductive members 61 to another one of the plurality of first conductive members 61 is, for example, along the second direction D2.

For example, the third electrode 53 extends along the third direction D3. A plurality of third electrodes 53 may be provided. A direction from one of the plurality of third electrodes 53 to another one of the plurality of third electrodes 53 is along the second direction D2, for example.

A plurality of the first conductive portions 52a may be provided corresponding to the plurality of the first conductive members 61. A plurality of the second conductive portions 52b may be provided corresponding to the plurality of the third electrodes 53.

Figure 2:
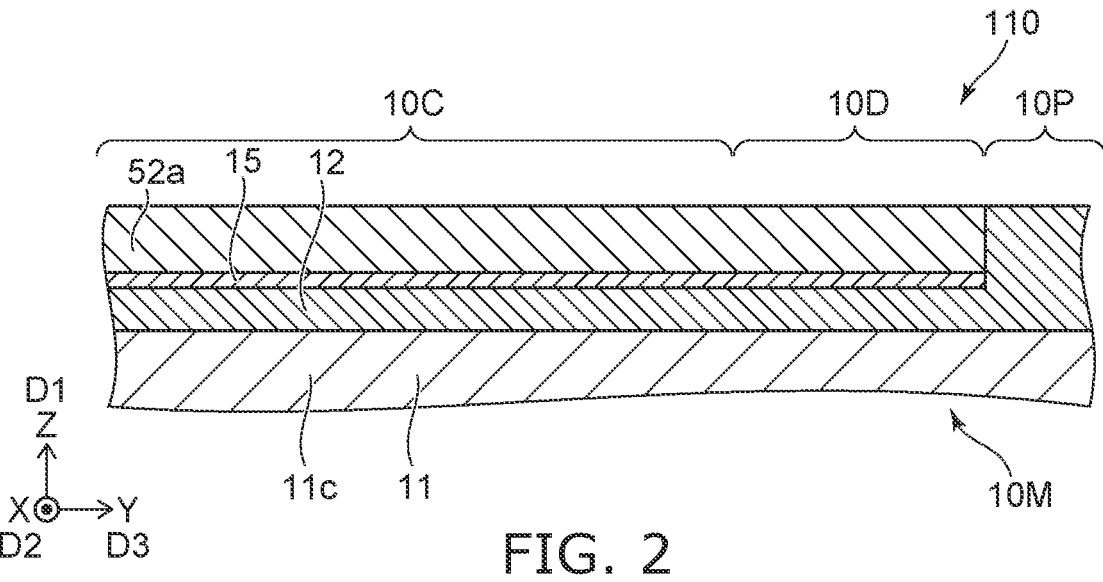
FIG. 2 is a schematic cross-sectional view illustrating the semiconductor device according to the first embodiment.

FIG. 2 is a schematic cross-sectional view illustrating the semiconductor device according to the first embodiment.

FIG. 2 is a cross-sectional view corresponding to the line A1-A2 of FIG. 1. In FIG. 2, some elements such as the first electrode 51 are omitted.

As shown in FIG. 2, the semiconductor member 10M includes a cell portion 10C and a terminal portion 10P. The terminal portion 10P is outside the cell portion 10C. A cell end portion 10D may be provided between the cell portion 10C and the terminal portion 10P. The cell portion 10C and the cell end portion 10D are, for example, an active area. The cell portion 10C may be a central portion of the active area, for example.

In the semiconductor device 110 illustrated in FIG. 2, the fifth semiconductor region 15 is strip-shaped. The fifth semiconductor region 15 extends along the third direction D3.

As described below, the pattern shape of the fifth semiconductor region 15 may be changed in various ways.

Second Embodiment

Figure 3:
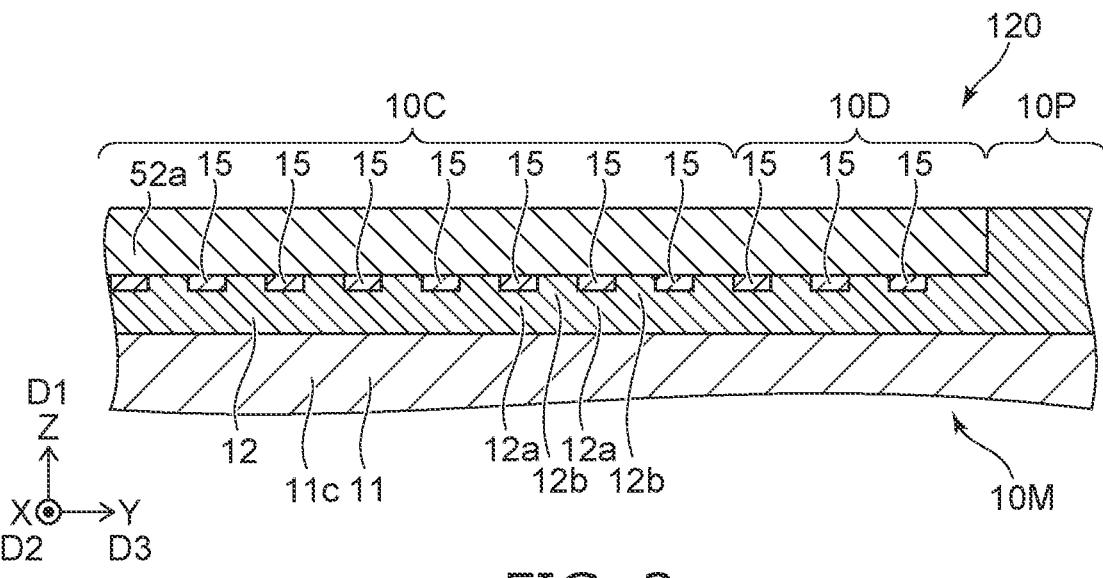
FIG. 3 is a schematic cross-sectional view illustrating a semiconductor device according to a second embodiment.

FIG. 3 is a schematic cross-sectional view illustrating a semiconductor device according to a second embodiment.

FIG. 3 is a cross-sectional view corresponding to the line A1-A2 of FIG. 1. In FIG. 3, some elements such as the first electrode 51 are omitted.

As shown in FIG. 3, in a semiconductor device 120 according to the embodiment, a plurality of the fifth semiconductor regions 15 are provided. Except for this, the configuration of the semiconductor device 120 may be the same as the configuration of the semiconductor device 110.

As shown in FIG. 3, a direction from one of the plurality of the fifth semiconductor regions 15 to another one of the plurality of the fifth semiconductor regions 15 is along the third direction D3. The third direction D3 is, for example, the Y-axis direction.

For example, as shown in FIG. 3, the second semiconductor region 12 includes the first semiconductor portion 12a and the second semiconductor portion 12b. The direction from the first semiconductor portion 12a to the second semiconductor portion 12b is along the third direction D3. The fifth semiconductor region 15 is located between the first semiconductor portion 12a and the first conductive portion 52a in the first direction D1. The second semiconductor portion 12b is in contact with the first conductive portion 52a.

As shown in FIG. 3, a plurality of second semiconductor portions 12b may be provided. A direction from one of the plurality of second semiconductor portions 12b to another one of the plurality of second semiconductor portions 12b is along the third direction D3. A plurality of first semiconductor portions 12a may be provided. The direction from one of the plurality of first semiconductor portions 12a to another one of the plurality of first semiconductor portions 12a is along the third direction D3. One of the plurality of first semiconductor portions 12a is provided between one of the plurality of second semiconductor portions 12b and another one of the plurality of second semiconductor portions 12b.

In the semiconductor device 120, a region where the fifth semiconductor region 15 is provided and a region where the fifth semiconductor region 15 is not provided are provided. For example, the hole injection amount can be adjusted according to the area of the fifth semiconductor region 15 (For example, the n-contact layer). The loss (for example, recovery loss) can be suppressed while obtaining more proper operation.

Figure 4:
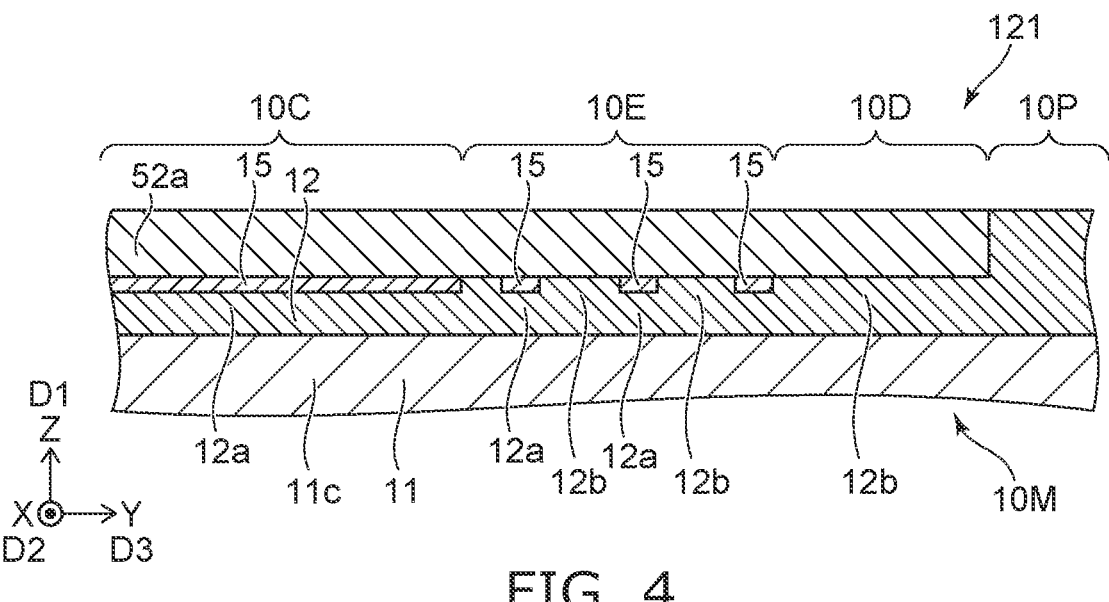
FIG. 4 is a schematic cross-sectional view illustrating a semiconductor device according to the second embodiment.

FIG. 4 is a schematic cross-sectional view illustrating a semiconductor device according to the second embodiment.

FIG. 4 is a cross-sectional view corresponding to the line A1-A2 of FIG. 1. In FIG. 4, some elements such as the first electrode 51 are omitted.

As shown in FIG. 4, also in a semiconductor device 121 according to the embodiment, a plurality of the fifth semiconductor regions 15 are provided. In the semiconductor device 121, the distribution of the plurality of the fifth semiconductor regions 15 is not uniform. Except for this, the configuration of the semiconductor device 121 may be the same as the configuration of the semiconductor device 120.

As shown in FIG. 4, in the semiconductor device 121, in the cell portion 10C, the fifth semiconductor region 15 is continuous strip-shaped. In the cell end portion 10D, a plurality of mutually independent the fifth semiconductor regions 15 are provided.

Thus, the semiconductor member 10M may include the cell portion 10C, the terminal portion 10P outside the cell portion 10C, and the cell end portion 10D between the cell portion 10C and the terminal portion 10P. The first semiconductor portion 12a provided with the fifth semiconductor region 15 is provided in the cell portion 10C. The second semiconductor portion 12b without the fifth semiconductor region 15 is provided in the cell end portion 10D.

For example, in at least a part of the cell end portion 10D, the fifth semiconductor region 15 is not provided and the second semiconductor portion 12b is provided. For example, holes are effectively ejected in the recovery operation at the cell end portion 10D. For example, the loss in the recovery can be effectively suppressed near the terminal region (cell end portion 10D) in the FWD region.

As the example shown in FIG. 4, an intermediate portion 10E may be provided between the cell portion 10C and the cell end portion 10D. A plurality of the fifth semiconductor regions may be provided in the intermediate portion 10E. In the intermediate portion 10E, the first semiconductor portion 12a and the second semiconductor portion 12b may be provided.

In the semiconductor device 121, for example, an area ratio of the fifth semiconductor region 15 to a unit area in the cell end portion 10D is lower than an area ratio of the fifth semiconductor region 15 to a unit area in the cell portion 10C.

Figure 5:
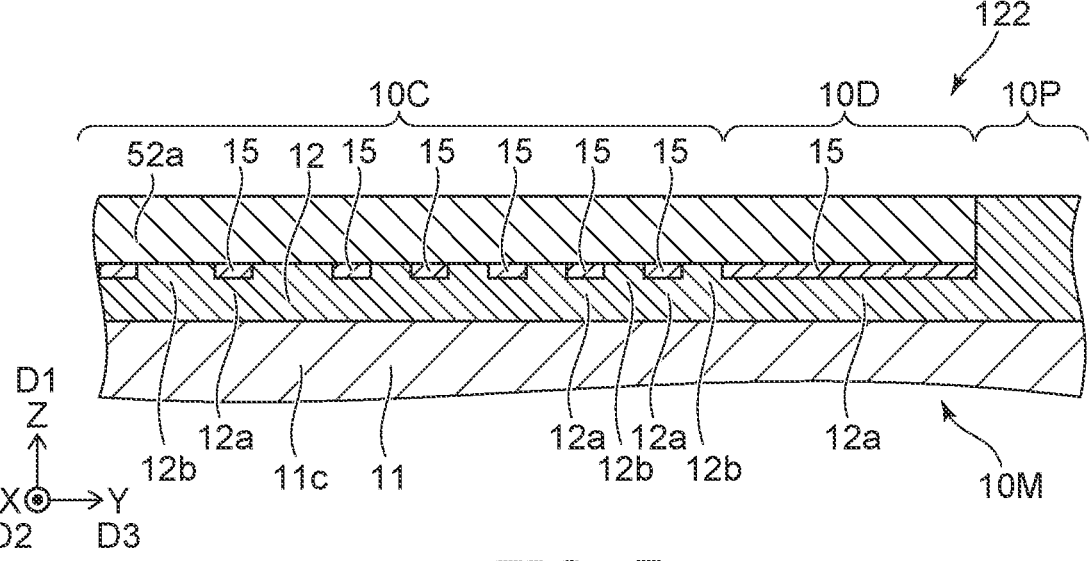
FIG. 5 is a schematic cross-sectional view illustrating a semiconductor device according to the second embodiment.

FIG. 5 is a schematic cross-sectional view illustrating a semiconductor device according to the second embodiment.

FIG. 5 is a cross-sectional view corresponding to the line A1-A2 of FIG. 1. In FIG. 5, some elements such as the first electrode 51 are omitted.

As shown in FIG. 5, also in a semiconductor device 122 according to the embodiment, a plurality of the fifth semiconductor regions 15 are provided. In the semiconductor device 122, the distribution of the plurality of the fifth semiconductor regions 15 is not uniform. Except for this, the configuration of the semiconductor device 122 may be the same as the configuration of the semiconductor device 120.

As shown in FIG. 5, in the semiconductor device 122, the semiconductor member 10M includes the cell portion 10C, the terminal portion 10P, and the cell end portion 10D. In the semiconductor device 122, the first semiconductor portion 12a provided with the fifth semiconductor region 15 is provided in the cell end portion 10D. In the cell end portion 10D, the fifth semiconductor region 15 is strip-shaped. The second semiconductor portion 12a in which without the fifth semiconductor region 15 is provided in the cell portion 10C.

In a semiconductor device 122, the hole injection is suppressed in the cell end portion 10D. The recovery loss can be effectively suppressed in the cell end portion 10D.

In the semiconductor device 122, in the cell portion 10C, a plurality of the fifth semiconductor regions 15 may be provided. In the cell portion 10C, a plurality of first semiconductor portions 12a and a plurality of second semiconductor portions 12b may be provided. For example, the direction from one of the plurality of second semiconductor portions 12b to another one of the plurality of second semiconductor portions 12b is along the third direction D3.

In the semiconductor device 122, for example, the area ratio of the fifth semiconductor region 15 to a unit area in the cell end portion 10D is higher than the area ratio of the fifth semiconductor region 15 to a unit area in the cell portion 10C.

The distribution of the fifth semiconductor region 15 described with respect to the semiconductor device 120, the semiconductor device 121, and the semiconductor device 122 may be applied to each of the plurality of first conductive portions 52a.

Third Embodiment

Figure 6:
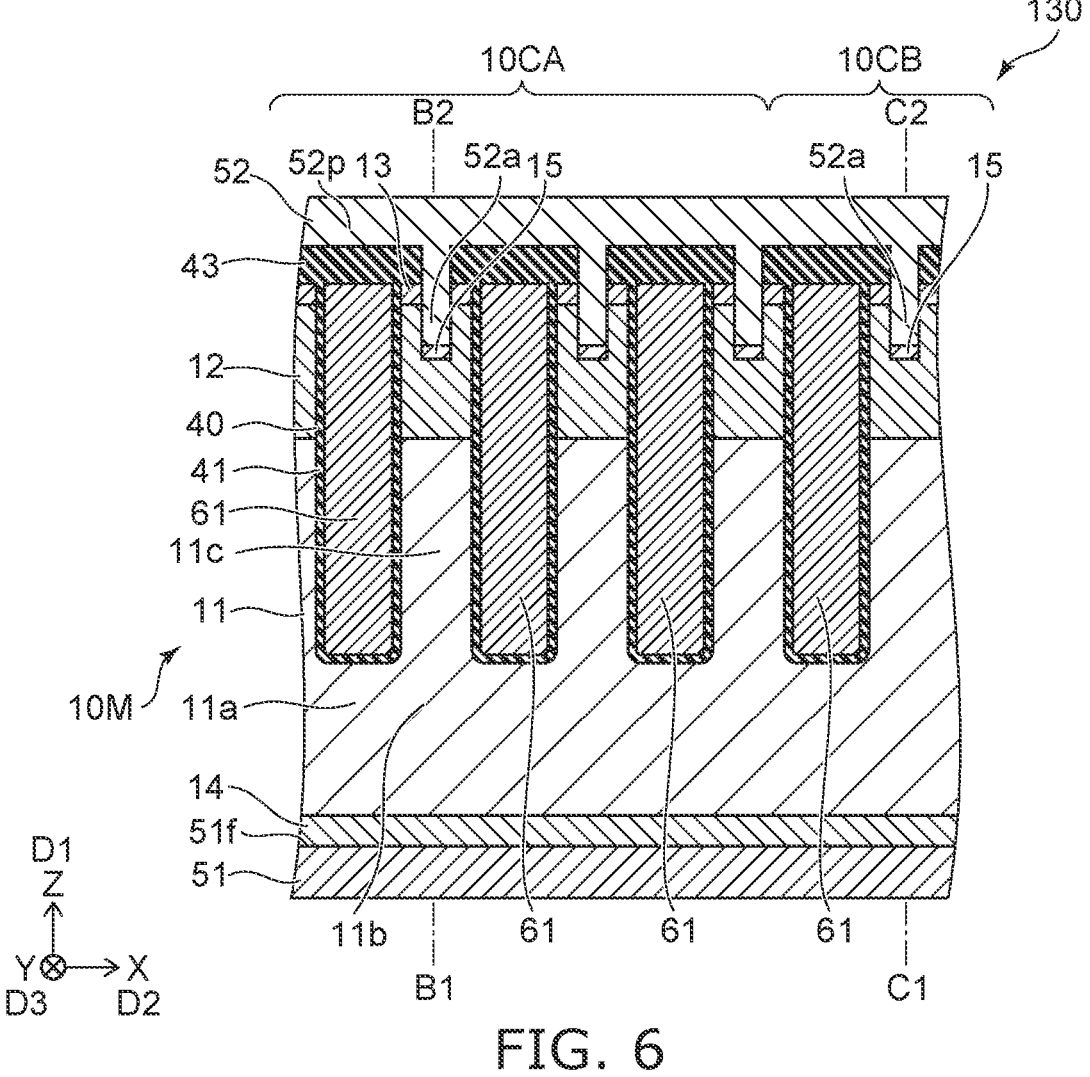
FIG. 6 is a schematic cross-sectional view illustrating a semiconductor device according to a third embodiment.

FIG. 6 is a schematic cross-sectional view illustrating a semiconductor device according to a third embodiment.

Figure 7A:
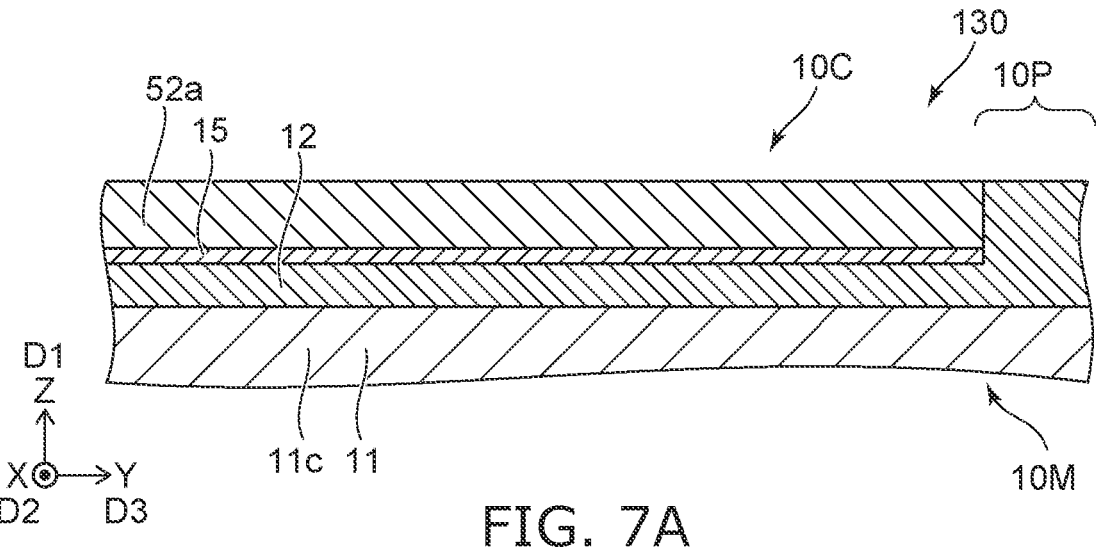
FIGS. 7A and 7B are schematic cross-sectional views illustrating the semiconductor device according to the third embodiment.
Figure 7B:
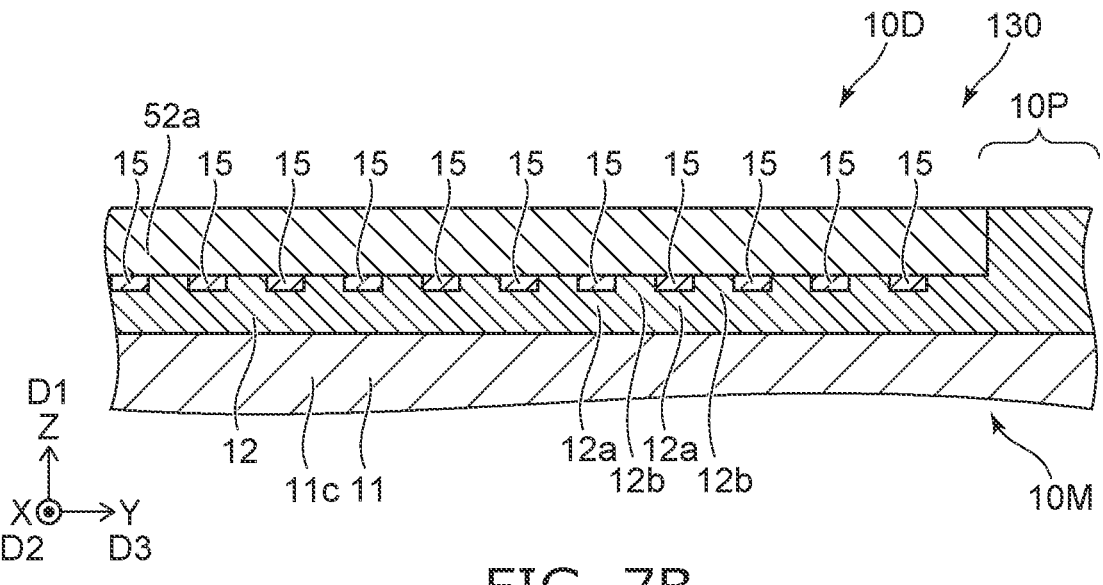

FIGS. 7A and 7B are schematic cross-sectional views illustrating the semiconductor device according to the third embodiment.

FIG. 7A is a cross-sectional view corresponding to the line B1-B2 of FIG. 6. FIG. 7B is a cross-sectional view corresponding to the line C1-C2 of FIG. 6.

As shown in FIG. 6, in a semiconductor device 130 according to the embodiment, a plurality of first conductive portions 52a are provided. The plurality of first conductive portions 52a extend, for example, along the third direction D3. The direction from one of the plurality of first conductive portions 52a to another one of the plurality of first conductive portions 52a is along the second direction D2.

As shown in FIG. 6, the semiconductor member 10M includes a first cell portion 10CA and a second cell portion 10CB. The second cell portion 10CB is outside the first cell portion 10CA. The first cell portion 10CA may correspond to the cell center portion. The second cell portion 10CB may correspond to a cell end side portion. The direction from the first cell portion 10CA to the second cell portion 10CB is along the second direction D2.

As shown in FIG. 6, one of the plurality of first conductive portions 52a is provided in the first cell portion 10CA. Another one of the plurality of first conductive portions 52a is provided in the second cell portion 10CB.

FIG. 7A illustrates a cross section of a portion corresponding to one of the plurality of first conductive portions 52a. FIG. 7B illustrates a cross section of a portion corresponding to another one of the plurality of first conductive portions 52a. In FIGS. 7A and 7B, some elements such as the first electrode 51 are omitted.

As shown in FIG. 7A, the semiconductor member 10M includes the fifth semiconductor region 15 of the first conductive type. The fifth semiconductor region 15 is located between the second semiconductor region 12 and one of the plurality of first conductive portions 52a in the first direction D1. In the example of FIG. 7A, the fifth semiconductor region 15 is strip-shaped.

As shown in FIG. 7B, at least a part of the other one of the plurality of first conductive portions 52a contacts the second semiconductor region 12. In this example, a plurality of the fifth semiconductor regions 15 are provided in the other one of the plurality of first conductive portions 52a. For example, a plurality of first semiconductor portions 12a and a plurality of second semiconductor portions 12b are provided. One of the plurality of the fifth semiconductor regions 15 is located between one of the plurality of first semiconductor portions 12a and the other one of the plurality of first conductive portions 52a. The plurality of second semiconductor portions 12b are in contact with the other one of the plurality of first conductive portions 52a.

In the semiconductor device 130, for example, the area ratio of the fifth semiconductor region 15 to a unit area in the cell end portion 10D is lower than the area ratio of the fifth semiconductor region 15 to a unit area in the cell portion 10C.

For example, on the cell end portion 10D, holes are effectively ejected in the recovery operation. Loss can be suppressed.

An example of simulation results of characteristics of the semiconductor device will be described below.

Figure 8:
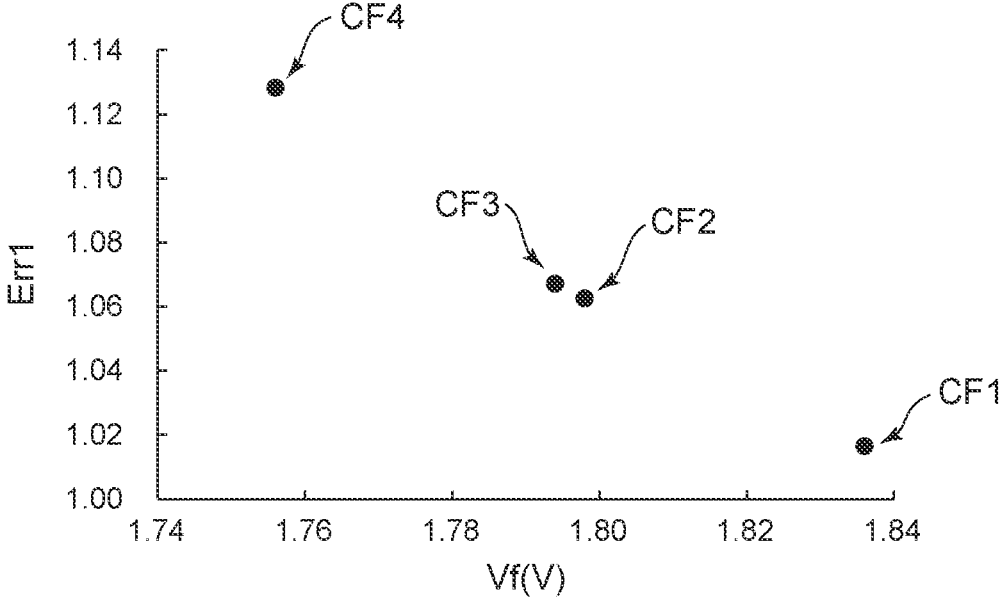
FIG. 8 is a graph illustrating characteristics of semiconductor devices.

FIG. 8 is a graph illustrating characteristics of semiconductor devices.

FIG. 8 illustrates the characteristics of the first element 10A. The horizontal axis of FIG. 8 is the forward voltage Vf. The vertical axis is the normalized recovery loss Err1. FIG. 8 illustrates the characteristics of a first configuration CF1, a second configuration CF2, a third configuration CF3, and a fourth configuration CF4.

The first configuration CF1 corresponds to the semiconductor device 110 illustrated in FIG. 1. In the first configuration CF1, the second configuration CF2, and the third configuration CF3, the fifth semiconductor region 15 is provided. In the first configuration CF1, the fifth semiconductor region 15 is in contact with the first conductive portion 52a. In the second configuration CF2 and the third configuration CF3, the fifth semiconductor region 15 is separated from the first conductive portion 52a. In the second configuration CF2, the distance in the Z-axis direction between the fifth semiconductor region 15 and the first conductive portion 52a is 0.2 μm. In the third configuration CF3, the distance in the Z-axis direction between the fifth semiconductor region 15 and the first conductive portion 52a is 0.5 μm. In the fourth configuration CF4, the fifth semiconductor region 15 is not provided.

As shown in FIG. 8, in the first configuration CF1, the recovery loss Err1 lower than that of the fourth configuration CF4 without the fifth semiconductor region 15 is obtained. According to the embodiments, the recovery loss (normalized recovery loss Err1) can be reduced.

In the second configuration CF2 and the third configuration CF3, the recovery loss Err1 lower than that of the fourth configuration CF4 without the fifth semiconductor region 15 is also obtained. When the fifth semiconductor region 15 is separated from the first conductive portion 52a, the recovery loss Err1 tends to increase. The fifth semiconductor region 15 is preferably in contact with the first conductive portion 52a.

In the embodiment, at least one of the first electrode 51 and the second electrode 52 includes at least one selected from the group consisting of, for example, Al, Ti, Ni, W and Au. The third electrode 53 may include, for example, polysilicon. The insulating member 40 may include, for example, silicon and oxygen. The insulating member 40 may include, for example, silicon oxide.

In the embodiments, information about length and thickness can be obtained by electron microscopy and the like. In the embodiments, the impurity concentration may be a carrier concentration. In the embodiments, the impurity concentration may be the concentration corresponding to the doping amount of the impurity. Information on the distribution and value of the impurity concentration in the semiconductor regions is obtained, for example, by secondary ion mass spectrometry (SIMS). The relative relationship between the impurity concentrations in the two semiconductor regions may be determined using, for example, a scanning capacitance microscopy (SCM). Information on the distribution and values of impurity concentrations may be obtained, for example, by spreading resistance analysis (SRA). The SCM and the SRA provide, for example, information on the relative relationship and the value of the carrier concentration in the semiconductor regions. For example, by assuming the activation rate of the impurity, the measurement results of SCM and SRA may provide information on at least one of the relative relationship between the impurity concentrations of the two semiconductor regions, the distribution of the impurity concentrations, or the value of the impurity concentrations.

Configuration 1

A semiconductor device, comprising:

a first electrode including a first face;

a second electrode including a first conductive region and a first conductive portion, the first conductive portion being electrically connected to the first conductive region;

a first conductive member provided between the first face and the first conductive region;

a semiconductor member provided between the first face and the second electrode, the semiconductor member including a first semiconductor region of a first conductive type, the first semiconductor region including a first partial region, a second partial region, and a third partial region, the first partial region being located between the first face and the first conductive member in a first direction perpendicular to the first face, a second direction from the first partial region to the second partial region crossing the first direction, the second partial region being located between the first face and the third partial region in the first direction, a direction from the first conductive member to the third partial region being along the second direction, a second semiconductor region of a second conductive type, a part of the second semiconductor region being provided between a part of the first conductive member and the first conductive portion, a third semiconductor region of the second conductive type, the second semiconductor region being located between the third partial region and the third semiconductor region in the first direction, a direction from another part of the first conductive member to the third semiconductor region being along the second direction, a third carrier concentration of the second conductive type in the third semiconductor region being higher than a second carrier concentration of the second conductive type in the second semiconductor region, a fourth semiconductor region of the first conductive type, the fourth semiconductor region being located between the first face and the first partial region, and between the first face and the second partial region, and a fifth semiconductor region of the first conductive type, the fifth semiconductor region being located between at least a part of the second semiconductor region and at least a part of the first conductive portion in the first direction; and an insulating member including a first insulating region, the first insulating region being provided between the semiconductor member and the first conductive member.

Configuration 2

The device according to Configuration 1, wherein a first distance between the first face and the first conductive portion along the first direction is shorter than a second distance between the first face and the third semiconductor region along the first direction.

13

14

Configuration 3

The device according to Configuration 1 or 2, wherein the fifth semiconductor region contacts the at least the part of the second semiconductor region.

Configuration 4

The device according to Configuration 1 or 2, wherein the second semiconductor region includes a first semiconductor portion and a second semiconductor portion, a third direction from the first semiconductor portion to the second semiconductor portion crosses a plane including the first direction and the second direction, the fifth semiconductor region is located between the first semiconductor portion and the first conductive portion in the first direction, and the second semiconductor portion contacts the first conductive portion.

Configuration 5

The device according to Configuration 4, wherein the semiconductor member includes a cell portion, a terminal portion outside the cell portion, and a cell end portion between the cell portion and the terminal portion, the first semiconductor portion is provided in the cell portion, and the second semiconductor portion is provided in the cell end portion.

Configuration 6

The device according to Configuration 5, wherein a plurality of the second semiconductor portions are provided, and a direction from one of the plurality of second semiconductor portions to another one of the plurality of second semiconductor portions is along the third direction.

Configuration 7

The device according to Configuration 4, wherein the semiconductor member includes a cell portion, a terminal portion outside the cell portion, and a cell end portion between the cell portion and the terminal portion, the first semiconductor portion is provided in the cell end portion, and the second semiconductor portion is provided in the cell portion.

Configuration 8

The device according to Configuration 7, wherein a plurality of the second semiconductor portions are provided, and a direction from one of the plurality of second semiconductor portions to another one of the plurality of second semiconductor portions is along the third direction.

Configuration 9

The device according to Configuration 4, wherein a plurality of the first semiconductor portions are provided, a direction from one of the plurality of first semiconductor portions to another one of the plurality of first semiconductor portions is along the third direction, and the second semiconductor portion is located between the one of the plurality of first semiconductor portions and the other one of the plurality of first semiconductor portions.

Configuration 10

The device according to Configuration 1 or 2, wherein a plurality of the fifth semiconductor regions are provided, and a direction from one of the plurality of fifth semiconductor regions to another one of the plurality of fifth semiconductor regions is along a third direction crossing a plane including the first direction and the second direction.

Configuration 11

The device according to Configuration 1 or 2, wherein a plurality of the first conductive portions are provided, a direction from one of the plurality of first conductive portions to another one of the plurality of first conductive portions is along the second direction, the fifth semiconductor region is located between the second semiconductor region and the one of the plurality of first conductive portions in the first direction, and at least a part of the other one of the plurality of first conductive portions contacts the second semiconductor region.

Configuration 12

The device according to Configuration 11, wherein the semiconductor member includes a first cell portion and a second cell portion outside the first cell portion, the one of the plurality of first conductive portions is provided in the first cell portion, and the other one of the plurality of first conductive portions is provided in the second cell portion.

Configuration 13

The device according to any one of Configurations 1 to 12, wherein the first conductive portion make a Schottky contact with the fifth semiconductor region.

Configuration 14

The device according to any one of Configurations 1 to 13, wherein the first conductive member is electrically connected to the second electrode, or the first conductive member can be electrically connected to the second electrode.

Configuration 15

The device according to any one of Configurations 1-12, further comprising:

a third electrode, the second electrode including a second conductive region and a second conductive portion, the second conductive portion being electrically connected to the second conductive region, a direction from the first conductive region to the second conductive region is along the second direction, the third electrode being located between the first face and the second conductive region, the semiconductor member further including a sixth semiconductor region of the second conductive type, a seventh semiconductor region of the first conductive type, and an eighth semiconductor region of the second conductive type, the first semiconductor region including a fourth partial region, a fifth partial region, and a sixth partial region, the fourth partial region being located between the first face and the third electrode in the first direction, a direction from the fourth partial region to the fifth partial region being along the second direction, the fifth partial region being located between the first face and the sixth partial region in the first direction, a direction from the third electrode to the sixth partial region being along the second direction, a part of the sixth semiconductor region being located between a part of the third electrode and the second conductive portion in the second direction, the sixth semiconductor region being located between the sixth partial region and the seventh semiconductor region in the first direction, the seventh semiconductor region being located between another part of the third electrode and the second conductive portion, the eighth semiconductor region being located between the first face and the fourth partial region, and between the first face and the fifth partial region, the insulating member further including a second insulating region, and the second insulating region being provided between the semiconductor member and the third electrode.

Configuration 16

The device according to Configuration 15, wherein the semiconductor member further includes a ninth semiconductor region of the second conductive type, the ninth semiconductor region is provided between the sixth semiconductor region and the second conductive portion, and a ninth carrier concentration of the second conductive type in the ninth semiconductor region is higher than a sixth carrier concentration of the second conductive type in the sixth semiconductor region.

Configuration 17

The device according to Configuration 15 or 16, wherein the first conductive portion makes a Schottky contact with the fifth semiconductor region.

Configuration 18

The device according to any one of Configurations 15 to 17, wherein the second conductive portion includes a material different from a material included in the first conductive portion.

Configuration 19

The device according to any one of Configurations 15 to 17, wherein the first conductive portion includes at least one selected from the group consisting of Pt, V, Ti, TiN and Ni, and the second conductive portion includes at least one selected from the group consisting of Al, W and Ta.

Configuration 20

The device according to any one of Configurations 1 to 19, wherein a fifth carrier concentration of the first conductive type in the fifth semiconductor region is higher than a first carrier concentration of the first conductive type in the first semiconductor region.

According to the embodiment, a semiconductor device capable of obtaining stable characteristics and a method for manufacturing the same can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and methods for manufacturing the same described above as embodiments of the invention also are within the scope of the invention to the extent that the purport of the invention are included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode including a first face;

a second electrode including a first conductive region and a first conductive portion, the first conductive portion being electrically connected to the first conductive region;

a first conductive member provided between the first face and the first conductive region;

a semiconductor member provided between the first face and the second electrode, the semiconductor member including, a first semiconductor region of a first conductive type, the first semiconductor region including a first partial region, a second partial region, and a third partial region, the first partial region being located between the first face and the first conductive member in a first direction perpendicular to the first face, a second direction from the first partial region to the second partial region crossing the first direction, the second partial region being located between the first face and the third partial region in the first direction, a direction from the first conductive member to the third partial region being along the second direction, a second semiconductor region of a second conductive type, a part of the second semiconductor region being provided between a part of the first conductive member and the first conductive portion, a third semiconductor region of the second conductive type, the second semiconductor region being located between the third partial region and the third semiconductor region in the first direction, a direction from another part of the first conductive member to the third semiconductor region being along the second direction, a third carrier concentration of the second conductive type in the third semiconductor region being higher than a second carrier concentration of the second conductive type in the second semiconductor region, a fourth semiconductor region of the first conductive type, the fourth semiconductor region being located between the first face and the first partial region, and between the first face and the second partial region, and a fifth semiconductor region of the first conductive type, the fifth semiconductor region being located between at least a part of the second semiconductor region and at least a part of the first conductive portion in the first direction, a part of the fourth semiconductor region that is aligned with the fifth semiconductor region in the first direction being in physical contact with the first electrode; and a first insulating member including a first insulating region, the first insulating region being provided between the semiconductor member and the first conductive member.

2. The device according to claim 1, wherein a first distance between the first face and the first conductive portion along the first direction is shorter than a second distance between the first face and the third semiconductor region along the first direction.

3. The device according to claim 1, wherein the fifth semiconductor region contacts the part of the second semiconductor region.

4. The device according to claim 1, wherein the second semiconductor region includes a first semiconductor portion and a second semiconductor portion, a third direction from the first semiconductor portion to the second semiconductor portion crosses a plane including the first direction and the second direction, the fifth semiconductor region is located between the first semiconductor portion and the first conductive portion in the first direction, and the second semiconductor portion contacts the first conductive portion.

5. The device according to claim 4, wherein the semiconductor member includes a cell portion, a terminal portion outside the cell portion, and a cell end portion between the cell portion and the terminal portion, the first semiconductor portion is provided in the cell portion, and the second semiconductor portion is provided in the cell end portion.

6. The device according to claim 5, wherein a plurality of the second semiconductor portions are provided, and a direction from one of the plurality of second semiconductor portions to another one of the plurality of second semiconductor portions is along the third direction.

7. The device according to claim 4, wherein the semiconductor member includes a cell portion, a terminal portion outside the cell portion, and a cell end portion between the cell portion and the terminal portion, the first semiconductor portion is provided in the cell end portion, and the second semiconductor portion is provided in the cell portion.

8. The device according to claim 7, wherein a plurality of the second semiconductor portions are provided, and a direction from one of the plurality of second semiconductor portions to another one of the plurality of second semiconductor portions is along the third direction.

9. The device according to claim 4, wherein a plurality of the first semiconductor portions are provided, a direction from one of the plurality of first semiconductor portions to another one of the plurality of first semiconductor portions is along the third direction, and the second semiconductor portion is located between the one of the plurality of first semiconductor portions and the other one of the plurality of first semiconductor portions.

10. The device according to claim 1, wherein a plurality of the fifth semiconductor regions are provided, and a direction from one of the plurality of fifth semiconductor regions to another one of the plurality of fifth semiconductor regions is along a third direction crossing a plane including the first direction and the second direction.

11. The device according to claim 1, wherein a plurality of the first conductive portions are provided, a direction from one of the plurality of first conductive portions to another one of the plurality of first conductive portions is along the second direction, the fifth semiconductor region is located between the second semiconductor region and the one of the plurality of first conductive portions in the first direction, and at least a part of the other one of the plurality of first conductive portions contacts the second semiconductor region.

12. The device according to claim 11, wherein the semiconductor member includes a first cell portion and a second cell portion outside the first cell portion, the one of the plurality of first conductive portions is provided in the first cell portion, and the other one of the plurality of first conductive portions is provided in the second cell portion.

13. The device according to claim 1, wherein the first conductive portion makes a Schottky contact with the fifth semiconductor region.

14. The device according to claim 1, wherein the first conductive member is electrically connected to the second electrode, or the first conductive member can be electrically connected to the second electrode.

15. A semiconductor device, comprising:

a first electrode including a first face;

a second electrode including a first conductive region and a first conductive portion, the first conductive portion being electrically connected to the first conductive region;

a first conductive member provided between the first face and the first conductive region;

a semiconductor member provided between the first face and the second electrode, the semiconductor member including a first semiconductor region of a first conductive type, the first semiconductor region including a first partial region, a second partial region, and a third partial region, the first partial region being located between the first face and the first conductive member in a first direction perpendicular to the first face, a second direction from the first partial region to the second partial region crossing the first direction, the second partial region being located between the first face and the third partial region in the first direction, a direction from the first conductive member to the third partial region being along the second direction, a second semiconductor region of a second conductive type, a part of the second semiconductor region being provided between a part of the first conductive member and the first conductive portion, a third semiconductor region of the second conductive type, the second semiconductor region being located between the third partial region and the third semiconductor region in the first direction, a direction from another part of the first conductive member to the third semiconductor region being along the second direction, a third carrier concentration of the second conductive type in the third semiconductor region being higher than a second carrier concentration of the second conductive type in the second semiconductor region, a fourth semiconductor region of the first conductive type, the fourth semiconductor region being located between the first face and the first partial region, and between the first face and the second partial region, and a fifth semiconductor region of the first conductive type, the fifth semiconductor region being located between at least a part of the second semiconductor region and at least a part of the first conductive portion in the first direction;

a first insulating member including a first insulating region, the first insulating region being provided between the semiconductor member and the first conductive member; and a third electrode, wherein:

the second electrode includes a second conductive region and a second conductive portion;

the second conductive portion is electrically connected to the second conductive region, a direction from the first conductive region to the second conductive region being along the second direction;

the third electrode is located between the first face and the second conductive region, and the semiconductor member further includes a sixth semiconductor region of the second conductive type, a seventh semiconductor region of the first conductive type, and an eighth semiconductor region of the second conductive type;

the first semiconductor region includes a fourth partial region, a fifth partial region, and a sixth partial region, the fourth partial region being located between the first face and the third electrode in the first direction, a direction from the fourth partial region to the fifth partial region being along the second direction, the fifth partial region being located between the first face and the sixth partial region in the first direction, a direction from the third electrode to the sixth partial region being along the second direction;

a part of the sixth semiconductor region is located between a part of the third electrode and the second conductive portion in the second direction;

the sixth semiconductor region is located between the sixth partial region and the seventh semiconductor region in the first direction;

the seventh semiconductor region is located between another part of the third electrode and the second conductive portion;

the eighth semiconductor region is located between the first face and the fourth partial region, and between the first face and the fifth partial region;

the first insulating member further includes a second insulating region; and the second insulating region is provided between the semiconductor member and the third electrode.

16. The device according to claim 15, wherein the semiconductor member further includes a ninth semiconductor region of the second conductive type, the ninth semiconductor region is provided between the sixth semiconductor region and the second conductive portion, and a ninth carrier concentration of the second conductive type in the ninth semiconductor region is higher than a sixth carrier concentration of the second conductive type in the sixth semiconductor region.

17. The device according to claim 15, wherein the first conductive portion makes a Schottky contact with the fifth semiconductor region.

18. The device according to claim 15, wherein the second conductive portion includes a material different from a material included in the first conductive portion.

19. The device according to claim 15, wherein the first conductive portion includes at least one selected from the group consisting of Pt, V, Ti, TiN and Ni, and the second conductive portion includes at least one selected from the group consisting of Al, W and Ta.

20. The device according to claim 1, wherein a fifth carrier concentration of the first conductive type in the fifth semiconductor region is higher than a first carrier concentration of the first conductive type in the first semiconductor region.

21. The device according to claim 1, further comprising:

a plurality of conductive members between the first face and the first conductive region and a plurality of insulating members, each of which is between the semiconductor member and one of the conductive members, wherein the first conductive member is one of the conductive members and the first insulating member is one of the insulating members, and two adjacent ones of the insulating members are spaced apart from the fifth semiconductor region.

\* \* \* \* \*